US009147678B2

(12) United States Patent
Kang et al.

(10) Patent No.: US 9,147,678 B2
(45) Date of Patent: Sep. 29, 2015

(54) RESISTOR AND FABRICATION METHOD THEREOF

(75) Inventors: Chih-Kai Kang, Tainan (TW);
Sheng-Yuan Hsueh, Tainan (TW);
Shu-Hsuan Chih, Kaohsiung (TW);
Po-Kuang Hsieh, Kaohsiung (TW);
Chia-Chen Sun, Kaohsiung (TW);
Po-Cheng Huang, Chiayi (TW);
Shih-Chieh Hsu, New Taipei (TW);
Chi-Horn Pai, Tainan (TW);
Yao-Chang Wang, Tainan (TW);
Jie-Ning Yang, Ping-Tung County (TW); Chi-Sheng Tseng, Kaohsiung (TW); Po-Jui Liao, Taichung (TW);
Kuang-Hung Huang, Tainan (TW);
Shih-Chang Chang, Tainan (TW)

(73) Assignee: UNITED MICROELECTRONICS CORP., Science-Based Industrial Park, Hsin-Chu (TW)

( * ) Notice: Subject to any disclaimer, the term of this patent is extended or adjusted under 35 U.S.C. 154(b) by 940 days.

(21) Appl. No.: 13/342,995

(22) Filed: Jan. 4, 2012

(65) Prior Publication Data

US 2013/0168816 A1    Jul. 4, 2013

(51) Int. Cl.
*H01L 29/00* (2006.01)
*H01L 27/06* (2006.01)
*H01L 49/02* (2006.01)

(52) U.S. Cl.
CPC ............ *H01L 27/0629* (2013.01); *H01L 28/24* (2013.01)

(58) Field of Classification Search
CPC ............ H01L 27/0288; H01L 27/0629; H01L 27/0716; H01L 27/0727
See application file for complete search history.

(56) References Cited

U.S. PATENT DOCUMENTS

| 6,406,956 | B1  | 6/2002  | Tsai |
| 2009/0057769 | A1 | 3/2009 | Wei |
| 2009/0090977 | A1* | 4/2009 | Freeman et al. ............. 257/379 |
| 2010/0328022 | A1 | 12/2010 | Fan |
| 2011/0117710 | A1 | 5/2011 | Lin |
| 2011/0147853 | A1 | 6/2011 | Lin |

* cited by examiner

*Primary Examiner* — Elias M Ullah
(74) *Attorney, Agent, or Firm* — Winston Hsu; Scott Margo

(57) ABSTRACT

The present invention provides a structure of a resistor comprising: a substrate having an interfacial layer thereon; a resistor trench formed in the interfacial layer; at least a work function metal layer covering the surface of the resistor trench; at least two metal bulks located at two ends of the resistor trench and adjacent to the work function metal layer; and a filler formed between the two metal bulks inside the resistor trench, wherein the metal bulks are direct in contact with the filler.

13 Claims, 12 Drawing Sheets

RESISTOR AND FABRICATION METHOD THEREOF

BACKGROUND OF THE INVENTION

1. Field of the Invention

The present invention generally relates to a resistor and fabrication method thereof. More particularly, the invention relates to a resistor integrated with a transistor having a metal gate and fabrication method thereof.

2. Description of the Prior Art

To increase the performance of transistors, metal gates are commonly used in semiconductors to replace the traditional polysilicon gates as control electrodes. Two metal gate processing approaches are mainly performed: a gate first process or a gate last process. The gate last process tends to replace the gate first process, since it allows a greater choice of materials for the high-k gate dielectric layer and the metal gate.

Additionally, resistors are elements that are often used to regulate voltage and to filter noise in a circuit. The resistors usually comprise polysilicon and silicide layers.

In the current semiconductor field, the fabricating processes are continuously improved with the aim of reaching higher yields, but the integration of the manufacturing methods of those different kinds of semiconductor devices is still very complicated and difficult. Therefore, a method for fabricating a resistor integrated with a transistor having a metal gate is still needed.

SUMMARY OF THE INVENTION

According to a first aspect of the invention, a structure of a resistor is provided. A substrate is provided with an interfacial layer thereon, a resistor trench is formed in the interfacial layer, the surface of the resistor trench is covered by at least a work function metal layer, at least two metal bulks are located at two ends of the resistor trench and adjacent to the work function metal layer, and a filler is formed between the two metal bulks inside the resistor trench while the metal bulks are direct in contact with the filler.

In another aspect of the invention, a method for forming a resistor integrated with a transistor having a metal gate is provided. The method includes providing a substrate having an interfacial layer thereon, wherein the interfacial layer has at least a resistor trench, forming a work function metal layer to cover an entire surface of the resistor trench, forming a metal layer to fill up the resistor trench; and forming an opening in the metal layer, wherein the opening may expose a portion of the work function metal layer on a bottom surface of the resistor trench.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 1-8 are schematic drawings illustrating a method for forming a resistor integrated with a transistor having a metal gate provided according to first exemplary embodiments of the present invention, wherein FIG. 2 is a schematic drawing of a step subsequent to FIG. 1 according to one embodiment of the present invention, FIG. 3 is a schematic drawing of a step subsequent to FIG. 2 according to one embodiment of the present invention, FIG. 4 is a schematic drawing of a step subsequent to FIG. 3 according to one embodiment of the present invention, FIG. 5 is a schematic drawing of a step subsequent to FIG. 4 according to one embodiment of the present invention, FIG. 6 is a schematic drawing of a step subsequent to FIG. 4 according to another embodiment of the present invention, FIG. 7 is a schematic drawing of a step subsequent to FIG. 5 according to one embodiment of the present invention, and FIG. 8 is a schematic drawing of a step subsequent to FIG. 7 according to one embodiment of the present invention.

Figure 1:
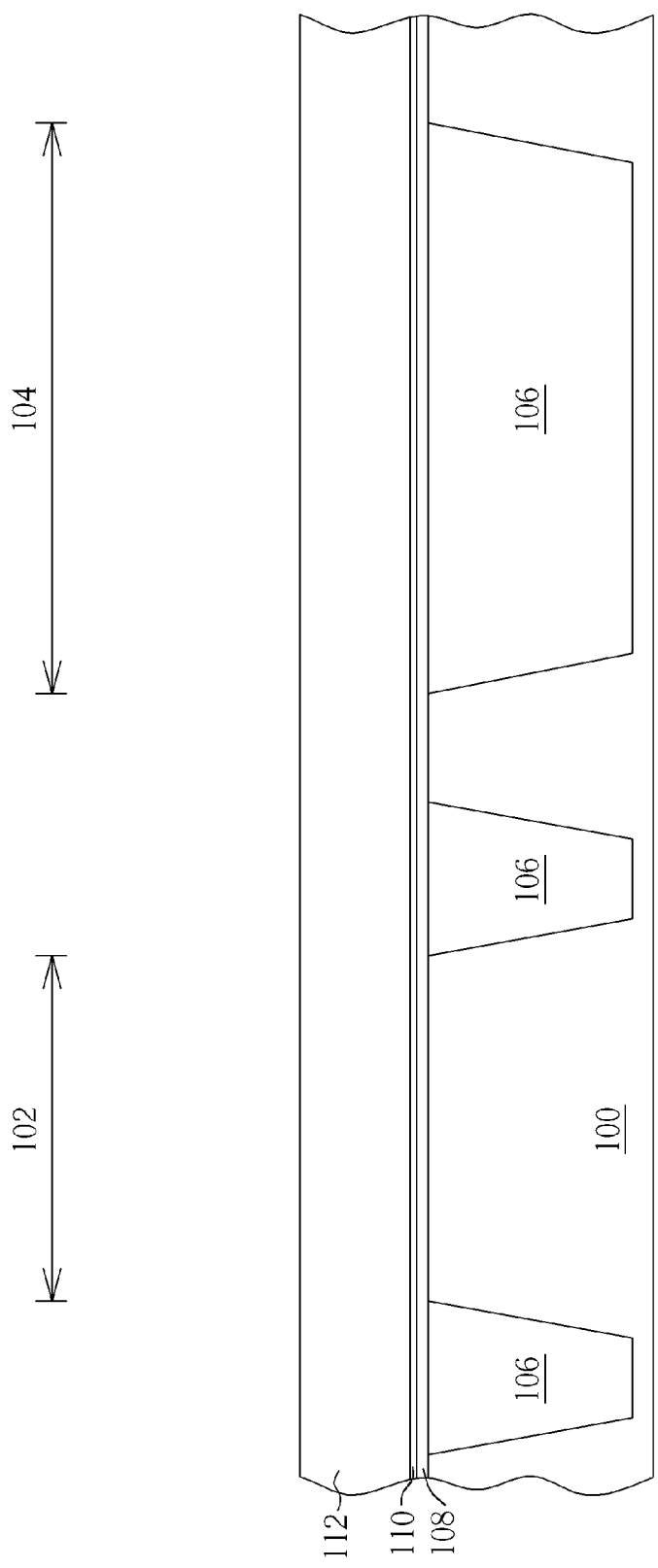

It should be noted that all the figures are for representation only. Relative dimensions and proportions of parts of the drawings are exaggerated or reduced in size, for the sake of clarity and convenience. The same reference signs are generally used to refer to corresponding or similar features in modified and different embodiments.

DETAILED DESCRIPTION

In the following description, numerous specific details are given to provide a thorough understanding of the invention. It will, however, be apparent to one skilled in the art that the invention may be practiced without these specific details. Furthermore, some well-known system configurations and process steps are not disclosed in detail, as these should be well-known to those skilled in the art.

Likewise, the drawings showing embodiments of the apparatus are not to scale and some dimensions are exaggerated for clarity of presentation. Also, where multiple embodiments are disclosed and described as having some features in common, similar features will usually be described with identical reference numerals for ease of illustration and description thereof.

Please refer to FIGS. 1-8, which are schematic drawings illustrating a method for forming a resistor integrated with a transistor having a metal gate provided by first exemplary embodiments of the present invention. As shown in FIG. 1, a substrate 100 having a transistor region 102 and a resistor region 104 defined thereon is provided. The substrate 100 includes a plurality of shallow trench isolations (STIs) 106 positioned between devices in order to provide electrical isolation. It is worth noting that a STI 106 is formed in the resistor region 104. A dielectric layer 108, a bottom barrier metal (BBM) 110, and a semiconductor layer such as a polysilicon layer 112 are sequentially formed on the substrate 100. As shown in FIG. 1, the dielectric layer 108 and the bottom barrier metal 110 are formed between the polysilicon layer 112 and the substrate 100. In the preferred embodiment, a method for forming a resistor integrated with a transistor having a metal gate is integrated with the high-k first process; therefore the dielectric layer 108 includes a high dielectric constant (high-k) material, such as rare earth metal oxide. The high-k gate dielectric layer 108 may include material selected from the group consisting of hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide (ZrO$_2$), strontium titanate oxide (SrTiO$_3$), zirconium silicon oxide (ZrSiO$_4$), hafnium zirconium oxide (HfZrO$_4$), strontium bismuth tantalate, (SrBi$_2$Ta$_2$O$_9$, SBT), lead zirconate titanate (PbZr$_x$Ti$_{1-x}$O$_3$, PZT), and barium strontium titanate (Ba$_x$Sr$_{1-x}$TiO$_3$, BST). Additionally, an interfacial layer (not shown) can be formed between the high-k gate dielectric layer 108 and the substrate 100. The bottom barrier metal 110 comprises titanium nitride (TiN), but is not limited thereto.

Figure 2:
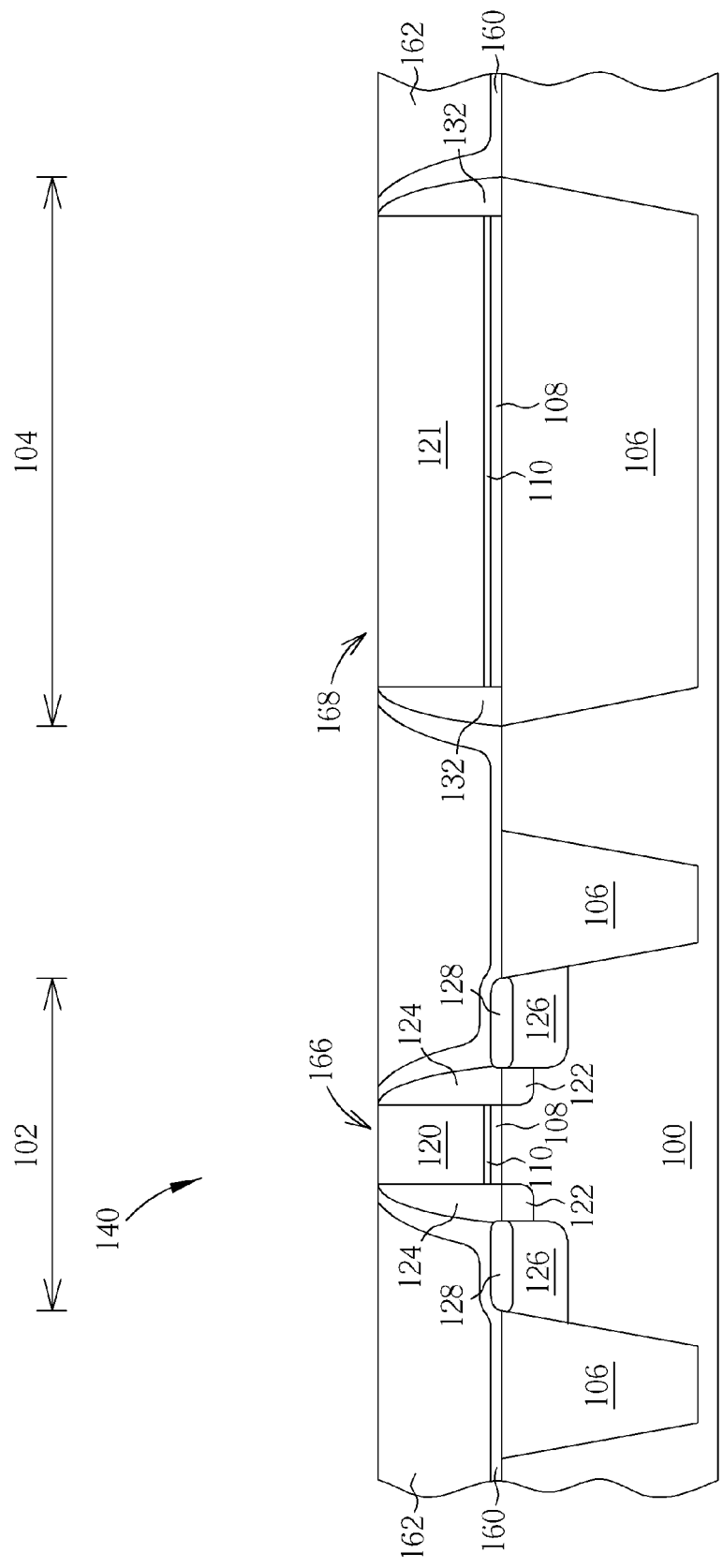

As shown in FIG. 2, the fabrication of a gate trench 166 and a resistor trench 168, within a transistor region 102 and a resistor region 104 respectively, is carried out with the following steps: first, the polysilicon layer 112, the bottom barrier metal 110, and the dielectric layer 108 are patterned; a polysilicon dummy gate 120 for a transistor is formed in the transistor region 102, and a polysilicon dummy portion 121 is formed within a resistor region 104; then, lightly-doped drains (LDDs) 122 for the transistor are formed in the substrate 100 at both sides of the polysilicon dummy gate 120 in the transistor region 102; spacers 124, 132 are respectively formed on the sidewalls of the polysilicon dummy gate 120 and the polysilicon dummy portion 121, and a source/drain 126 is formed in the substrate 100 at both sides of the spacer 124 in the transistor region 102. Hence, a transistor 140 having the polysilicon dummy gate 120 is obtained in the transistor region 102; then silicides 128 are formed on the source/drain 126, a contact etch stop layer (CESL) 160 and an inter-layer dielectric (ILD) layer 162 are sequentially formed. Since the steps and material choices for the abovementioned elements are well-known to those skilled in the art, those details are omitted herein in a purpose of brevity. Furthermore, selective strain scheme (SSS) can be used in this preferred embodiment. For example, a selective epitaxial growth (SEG) method can be used to form the source/drain 126. Please still refer to FIG. 2: after forming the CESL 160 and the ILD layer 162, a planarization process is performed to remove a portion of the CESL 160 and a portion of the ILD layer 162 to expose the polysilicon dummy gate 120 of the transistor 140 and the polysilicon dummy portion 121. As a consequence, a transistor 140 is fabricated within the transistor region 102.

Figure 3:
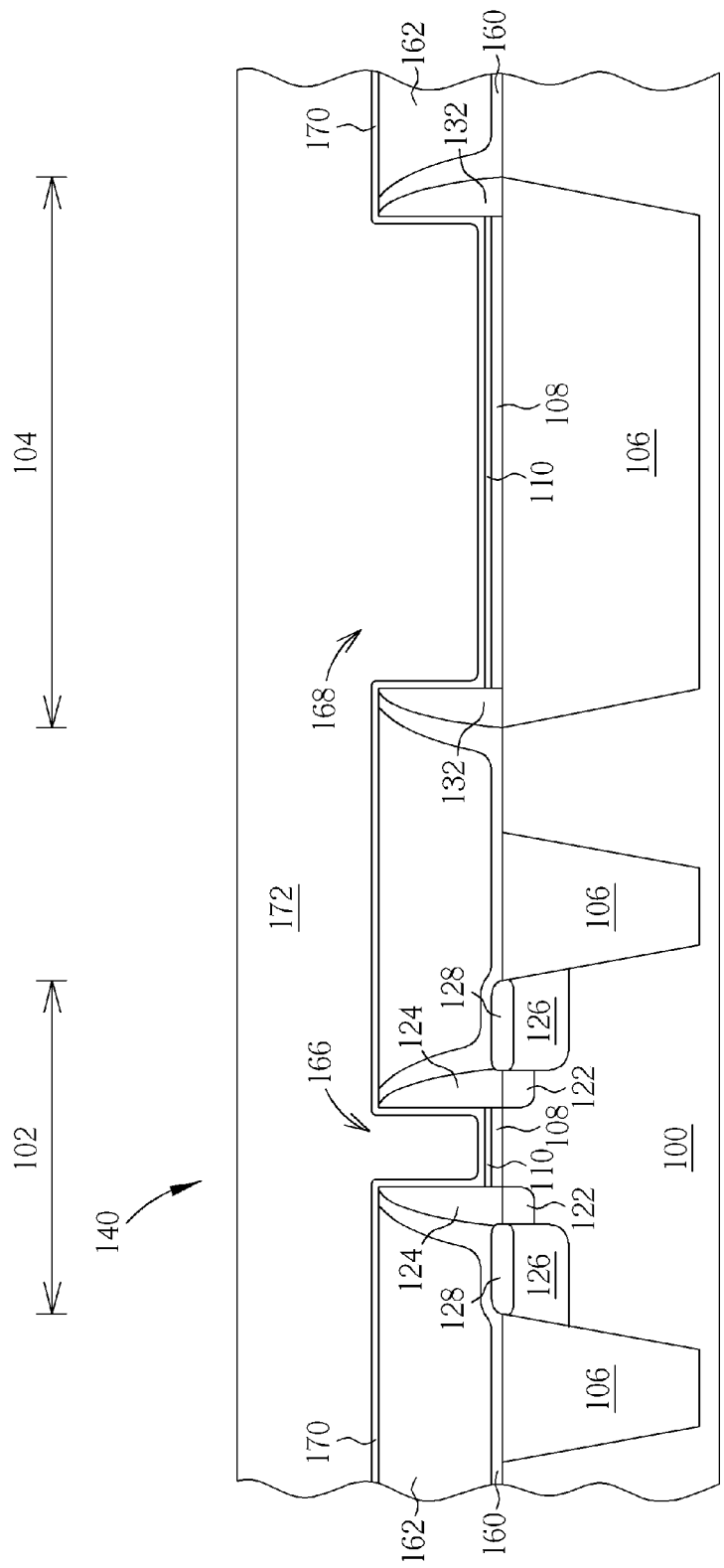

Please refer to FIG. 3. A suitable etching process, such as a dry etching process, is then performed. It is noteworthy that an etching rate of the polysilicon dummy gate 120 and the polysilicon dummy portion 121 is different from that of the CESL 160 and the ILD layer 162 which include dielectric material. Therefore only the exposed polysilicon dummy gate 120 and the exposed polysilicon dummy portion 121 are removed. Subsequently, a gate trench 166 is formed in the transistor 140 and a resistor trench 168 is simultaneously formed in resistor region 104. It is worth noting that the resistor trench 168 is defined by the ILD layer 162 and the CESL 160. As shown in FIG. 3, the bottom barrier metal 110 is exposed in the gate trench 166 and the resistor trench 168 by the etching process. After forming the trenches 166 and 168, an etch stop layer (not shown) can be formed on the bottom barrier metal 110 in both of the gate trench 166 and the resistor trench 168. The etch stop layer may include tantalum nitride (TaN) or silicon nitride (Si$_3$N$_4$), but not limited thereto. After forming the gate trench 166 and the resistor trench 168, a work function metal layer 170 required by the metal gate process is formed in both gate trench 166 and resistor trench 168. According to the preferred embodiment, the work function metal layer 170 comprises suitable materials, providing an appropriate work function for p-type transistor or n-type transistor. The work function metal layer 170 has a work function between 4.8 eV and 5.2 eV, or between 3.9 eV and 4.3 eV. Thereafter, a metal layer 172 is formed on the substrate 100 by filling up the gate trench 166 and the resistor trench 168. In the preferred embodiment, the metal layer 172 includes materials with low resistance and superior gap-filling characteristic, such as aluminum (Al), titanium aluminide (TiAl) or titanium aluminum oxide (TiAlO), but not limited to these. Additionally, a top barrier layer (not shown) can be formed between the work function metal layer 170 and the metal layer 172, if required.

Figure 4:
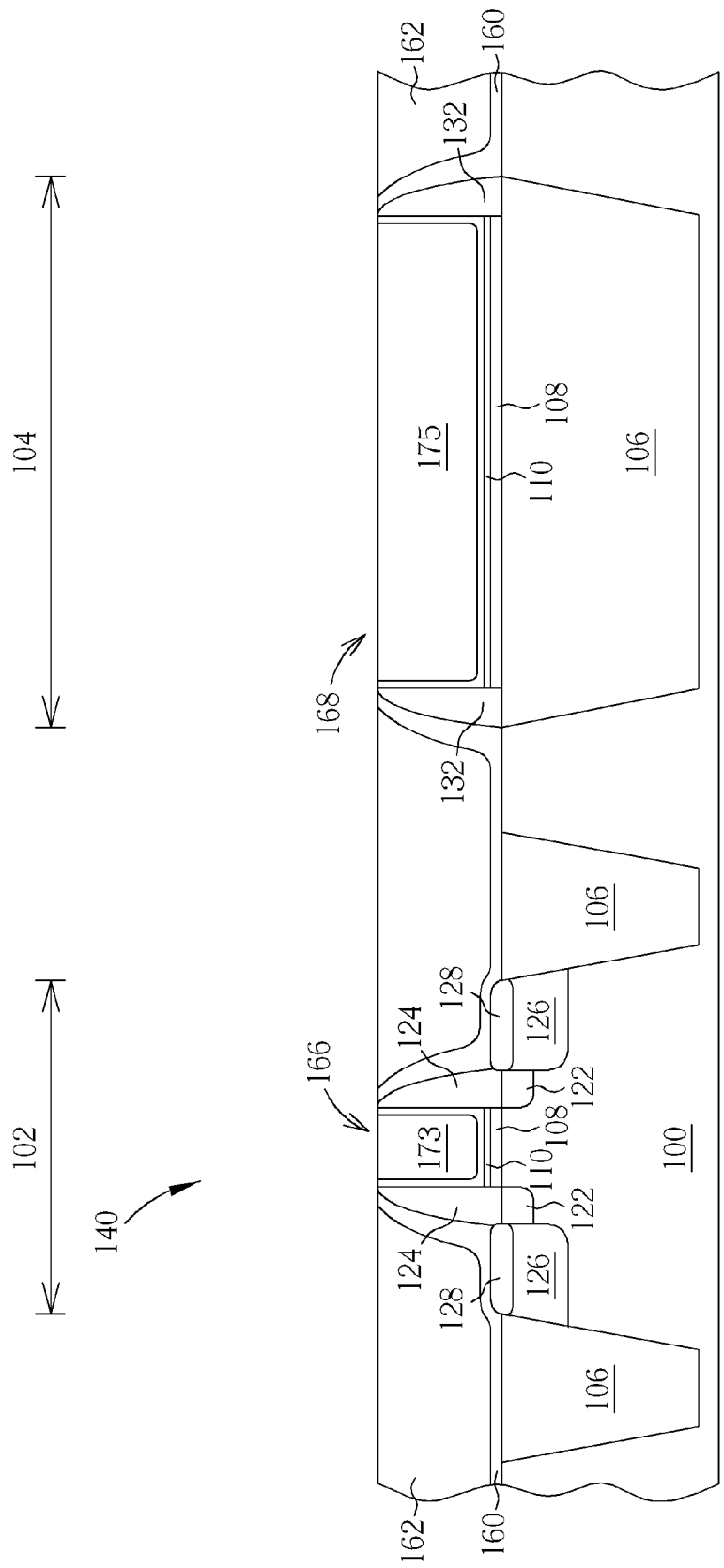

As shown in FIG. 4. After the above-mentioned steps, a planarization process is performed to remove a portion of the metal layer 172 and the work function metal layer 170 until the topmost surface of the metal layer 172 is approximately leveled with the surface of the ILD layer 162, which forms a gate metal 173 inside the gate trench 166, and a low resistance portion 175 in the resistor trench 168 simultaneously. It is worth noting that, parts of the low resistance portion 175 can be replaced by a high resistance material in the following steps in order to obtain a high resistance resistor within the resistor region 104.

Figure 5:
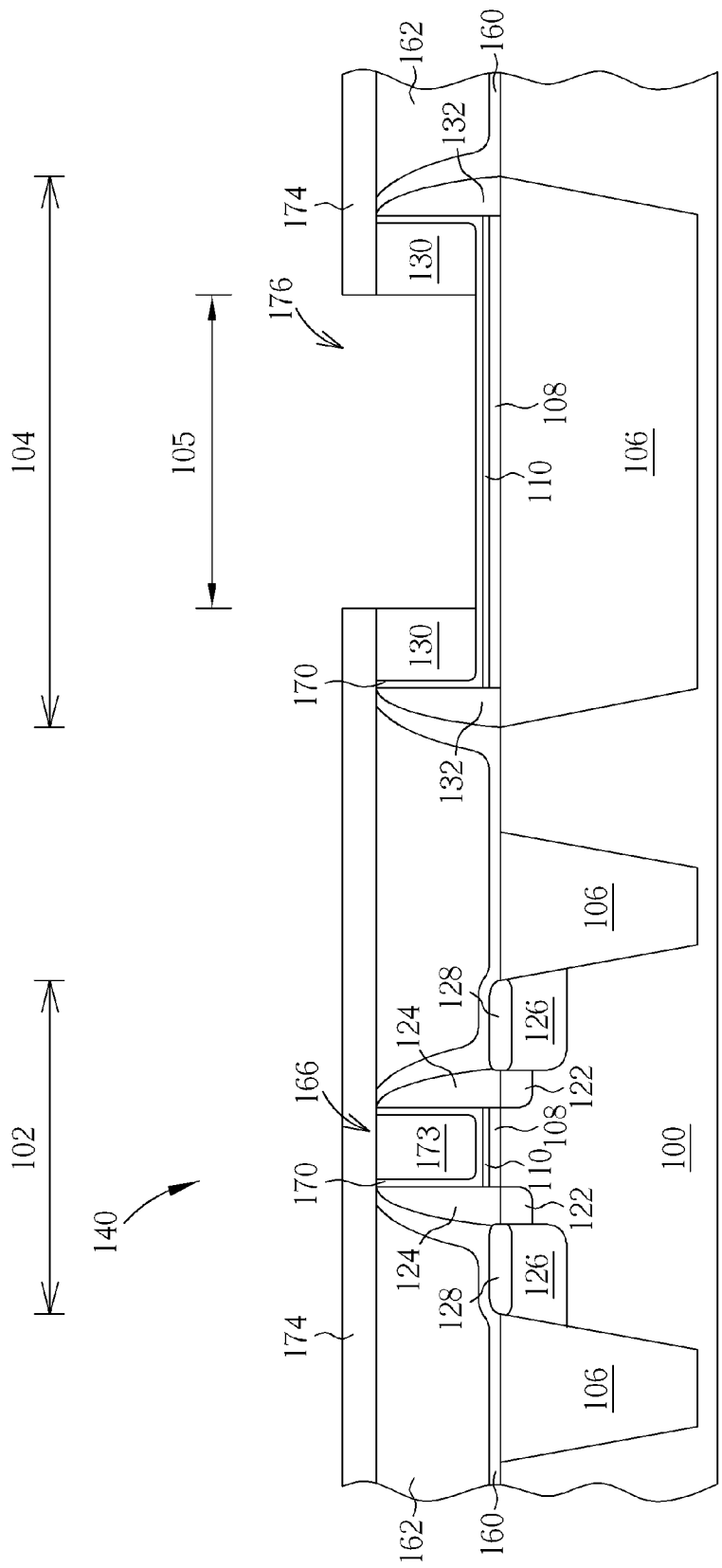
Figure 6:
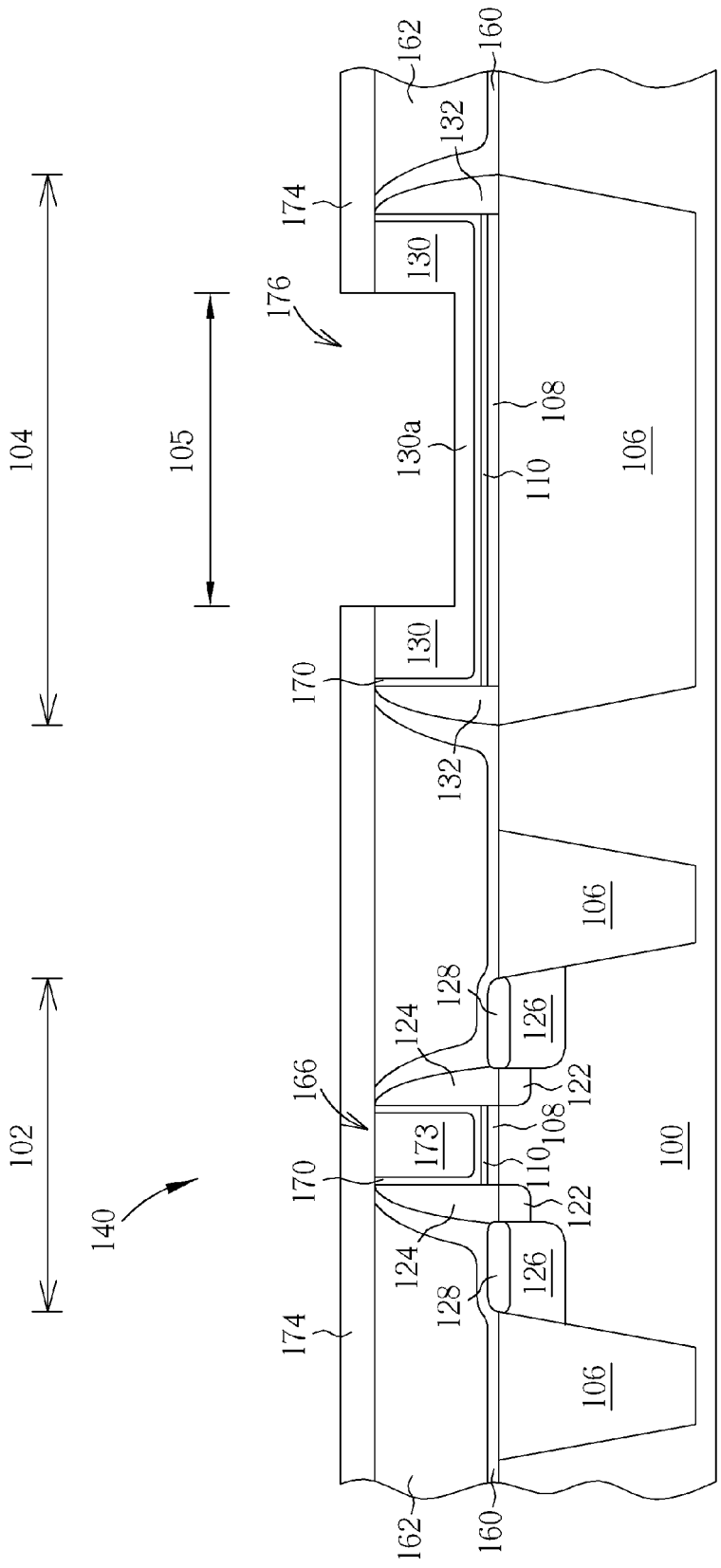

As illustrated in FIG. 5, a patterned hard mask 174 is then formed on the ILD layer 162. The patterned hard mask 174 may include silicon nitride (SiN), nitrogen doped carbide (NDC), or photoresist material, but not limited to this. It should be noted that, as shown in FIG. 5, the patterned hard mask 174 covers surface comprising the transistor region 102 and the resistor region 104, but not the surface within the main region 105. For that, the metal layer 172 (not shown) within the main region 105 may be removed in the following etching step. An etching process is then carried out to completely remove the metal layer 172 within the main region 105. Consequently, an opening 176 is formed to expose the surface of the work function metal layer 170 within the main region 105, while portions of the work function metal layer 170 inside the resistor region 104 are covered by metal bulks 130, located at both ends of the resistor trench 168. According to another embodiment of the invention, as shown in FIG. 6, however, the metal layer 172 within the main region 105 may be not removed completely. In this case, only a portion of the metal layer 172 is etched away so that a metal film 130a is formed on a surface of the work function metal layer. The metal film 130a is in electrical connect with the work function metal layer 170 and the metal bulks 130.

Figure 7:
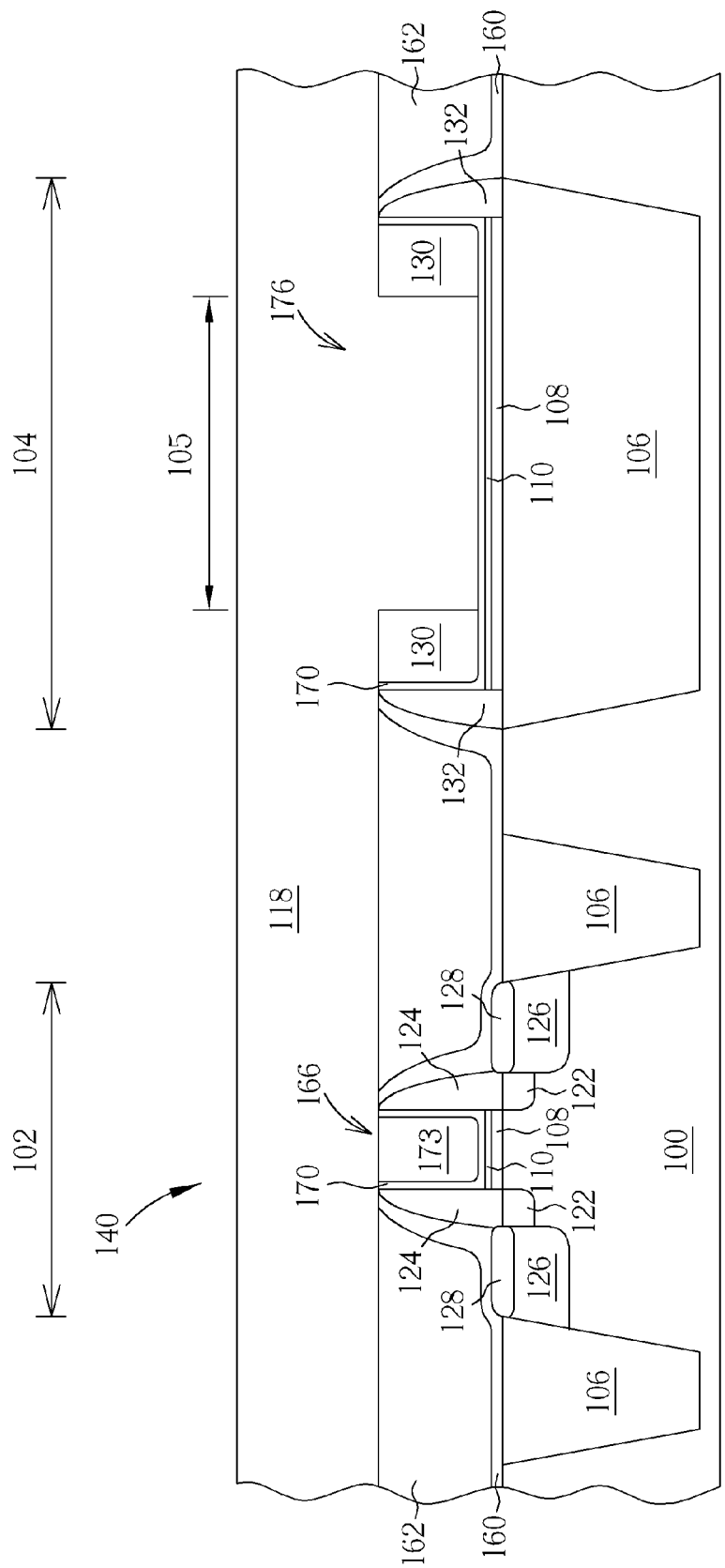

Please refer to FIG. 7. After forming the opening 176 within the main region 105, the patterned hard mask 174, like silicon nitride for example, may be removed optionally to expose the surface of the ILD layer 162, the gate metal 173, and the metal bulks 130. It should be noted that, a protection layer (not shown) may be formed underneath the patterned hard mask 174 in the transistor 140 region in order to prevent CESL 160 and spacers 124 and 132 from etching in the removing process of the patterned hard mask 174. According to another embodiment, the protection layer is not necessary if the patterned hard mask 174 is not removed. Thereafter, a deposition process is carried out to fill up the opening 176 with a filler 118. Depending on different requirements, the filler 118 may be selected from electrically conductive materials or electrically insulated materials. According to one embodiment of the invention, the filler 118 is an electrically insulated material, like nitrogen doped carbide (NDC), silicon dioxide, or the combination thereof, but not limited thereto. In this case, since the electrically insulated material has extremely high resistance, the current channel within the resistor region 104 includes only work function metal layer 170 and bottom barrier metal 110. According to another embodiment, however, if the filler 118 is electrically conductive, like doped-polysilicon for example, current from an external circuit may flow through the filler 118, work function metal layer 170, and bottom barrier layer 110 simultaneously depending on the resistance of each layer. In this case, in order to adjust the resistance of the filler 118, an ion implantation process may be further performed to reduce its resistance. For instance, when the filler 118 consists of polysilicon, dopants like boron or arsenic may be implanted therein with a predetermined concentration. It is worth noting that, if there is the metal film 130a remaining in the opening 176 as shown in FIG. 6, it may also serve as a part of the current channel within the resistor region 104. Depending on a film thickness of the metal film 130a and a conductivity of the filler 118, the metal film 130a could be a major current channel for transmitting current. In addition, if the metal film 130a remains inside the opening 176, the filler 118 is preferably chosen from the electrically insulated materials.

Furthermore, after the ion implantation process, an activation process may be carried out optionally to activate the dopants inside the filler 118. It should be noted that the temperature of the activation process is recommended to not exceed the thermal migration temperature of the metal bulks 130 and the metal film 130a (not shown), or the decomposition temperature of the work function metal layer 170. For example, if the metal bulks 130 and the metal film 130a include aluminum, the temperature is recommended to be kept under 400 degree C. As a consequence, after carrying out the ion implantation process, the resistance of the filler 118 may be reduced compared to the as-deposited filler 118. In this case, however, the resistance of the metal bulks 130 is still less than that of the filler 118 and the work function metal layer 170. According to one embodiment of the invention, a planarization process is performed to remove a portion of the filler 118. It is worth noting that, however, the patterned hard mask 174 may still exist between the filler 118 and the ILD layer 162 if the patterned hard mask 174 is not removed in the preceding removing process.

Figure 8:
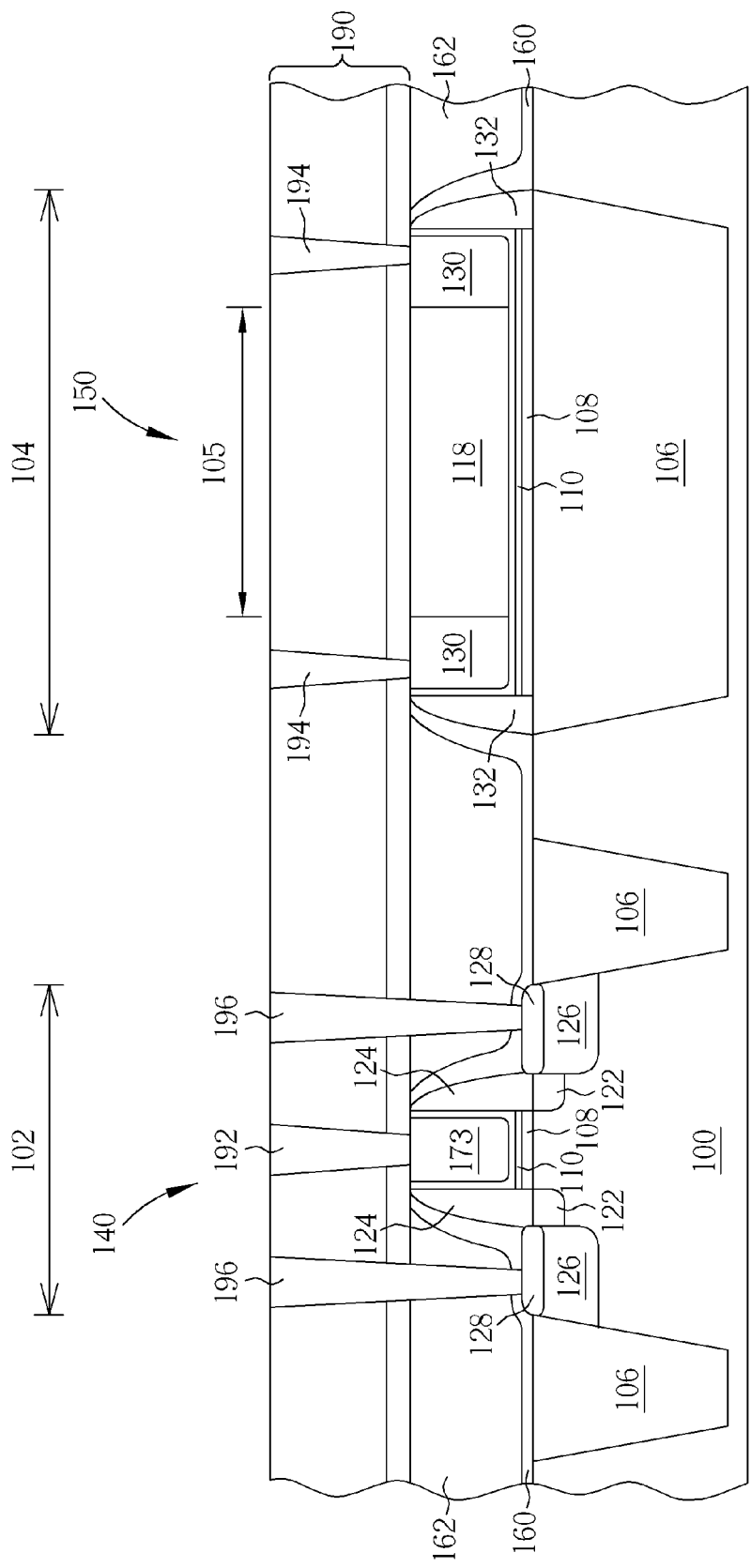

Please refer to FIG. 8. After forming the transistor 140 and the resistor 150, a planarization process may be performed to remove a portion of the filler 118 so that an upper surface of the filler 118 is level with the surface of the ILD 162. According to another embodiment, if the patterned hard mask 174 (not shown) is not removed, an upper surface of the filler 118 may be level with a surface of the patterned hard mask 174. Next, a multilayered dielectric layer 190 is formed on the substrate 100, and a first contact 192 electrically connected to the gate metal 173 of the transistor 140, second contacts 194 electrically connected to the metal bulks 130 of the resistor 150, and third contacts 196 electrically connected to the silicides 128 on the source/drain 126 of the transistor 140 are formed in the multilayered dielectric layer 190. It is worth noting that the contact process is simplified compared to the conventional contact process, wherein the contacts are landing on three different materials (the metal material of the metal gate, the metal bulks of the resistor, and the salicide formed on the source/drain), because the contacts 192, 194, and 196 are landing on two different materials (the metal materials of the gate metal 173 and the metal bulks 130, and the silicides 128). It is also worth noting that, the resistor 150 fabricated in the invention is also called high resistance resistor (HRR) because of the high resistance of the filler 118.

Figure 9:
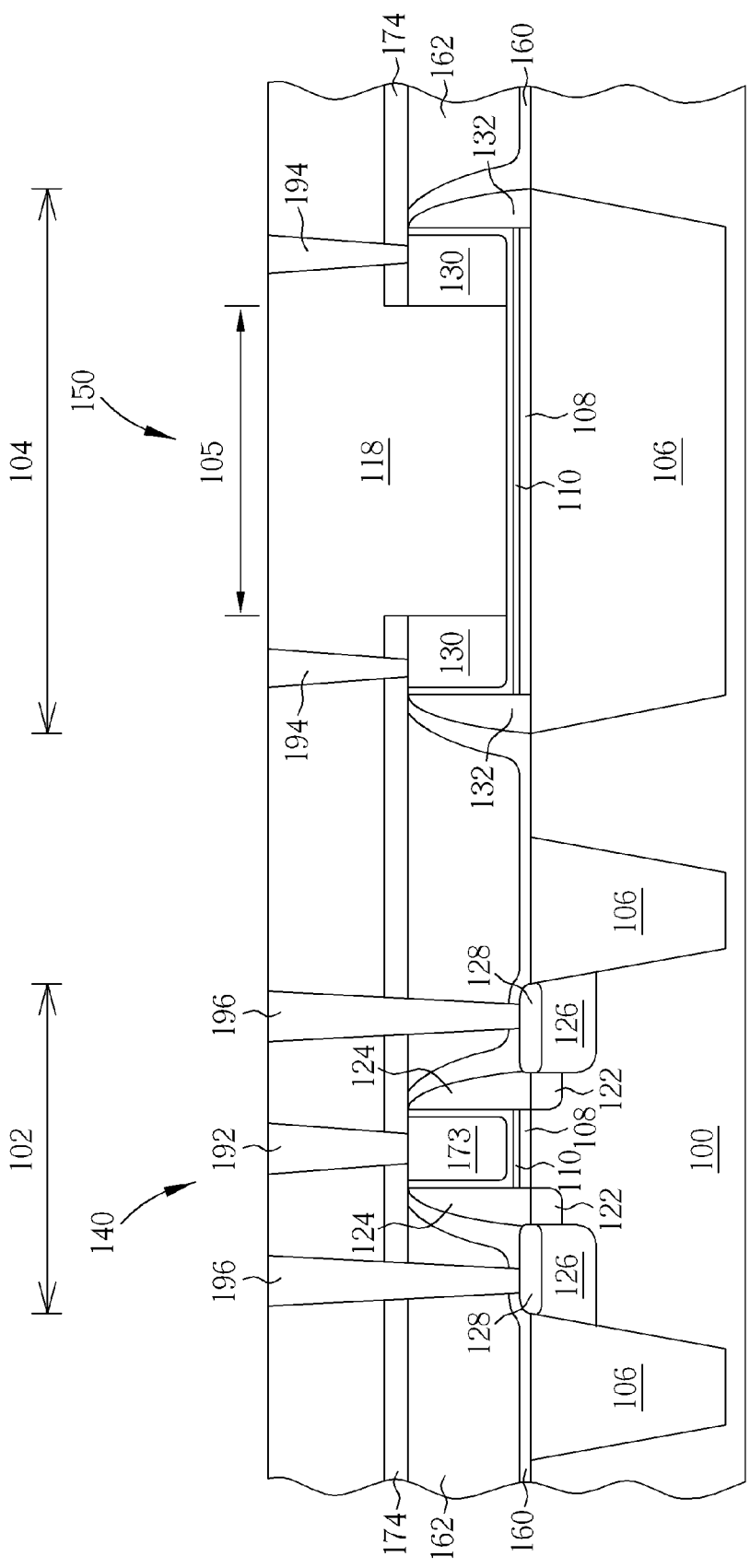
FIG. 9 is schematic drawing illustrating a method for forming a resistor integrated with a transistor having a metal gate according to still another embodiment of the present invention.

Please refer to FIG. 9. As similar to FIG. 8, the first contact 192 is electrically connected to the gate metal 173 of the transistor 140, the second contacts 194 is electrically connected to the metal bulks 130 of the resistor 150, and the third contacts 196 is electrically connected to the silicides 128 on the source/drain 126 of the transistor 140. According to this embodiment, however, the first contact 192, the second contact 194, and the third contacts 196 are embedded in the filler 118 comprising electrically insulated material, like nitrogen doped carbide (NDC), silicon dioxide, or the combination thereof, but not limited thereto. An additional planarization process may be performed to remove a portion of the filler 118 before the formation of the contacts 192, 194, 196, and the hard mask layer 174, silicon nitride or NDC for example, may exist on the surface of the ILD 162. The detailed description of the remaining fabricating method according to this embodiment is therefore omitted as this can be ascertained by referring to the previous paragraph.

Figure 10:
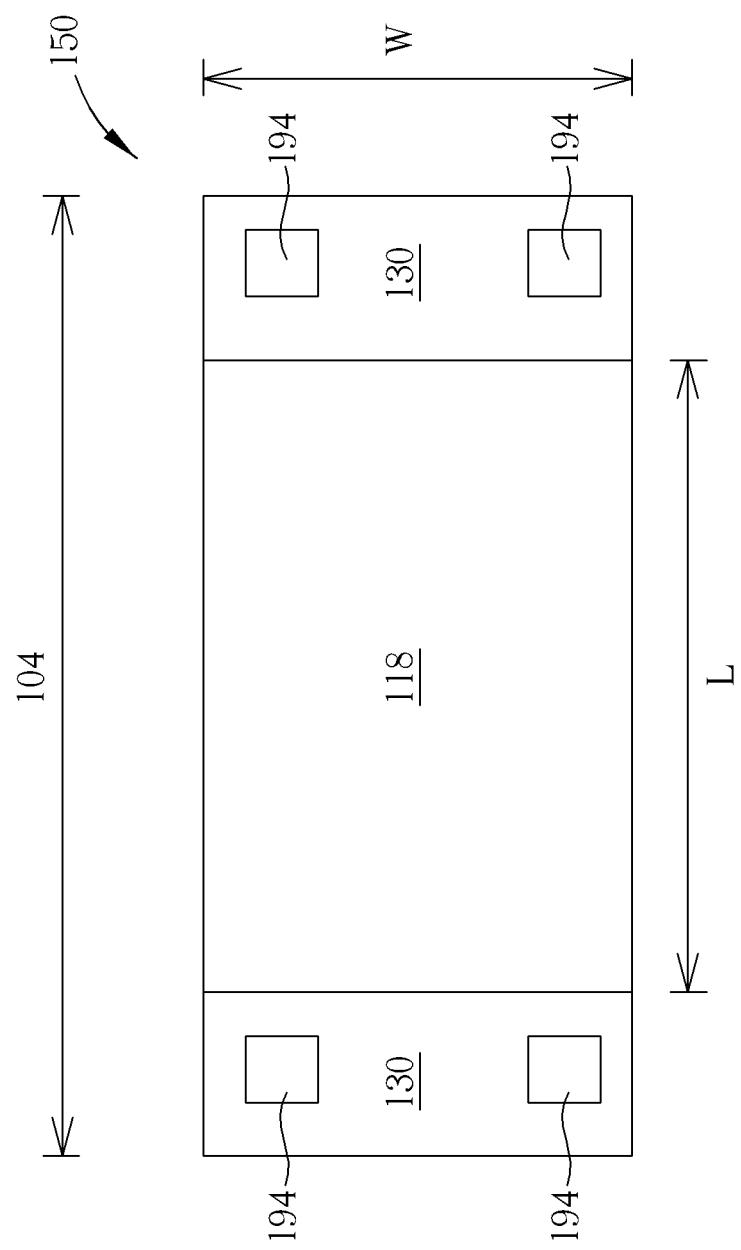
FIG. 10 is a schematic top view showing a partial layout in FIGS. 8 and 9.

Please refer to FIG. 10. FIG. 10 is a schematic top view showing a partial layout of FIGS. 8 and 9. In this case, four contacts 194 are electrically connected to the metal bulks 130 and the area of each contact 194 is smaller than that of each metal bulk 130. In addition, the filler 118 is sandwiched between two metal bulks 130 and no extra layer, barrier or work functional metal layer for example, exists at the interface between the metal bulks 130 and the filler 118. In the conventional HRRs, where work functional metal layers or bottom barrier layer have the same composition, the resistance of each HRR is mainly determined by the length L and width W of the resistor. That is to say, the resistances in the conventional HRRs with the same composition of work functional metal layers and bottom barrier layer are hardly adjusted to meet the requirements of the circuit design. According to the present invention, the resistance of the resistor 150 may be modulated simply by adjusting the doping concentration of the filler 118, which can therefore meet the requirements of the circuit design. In summary, according to the resistor 150 and the method for forming a resistor integrated with a transistor 140 having a metal gate 173 provided by the preferred embodiments, the method is easily integrated with the gate-last process and the high-k first process.

Figure 11:
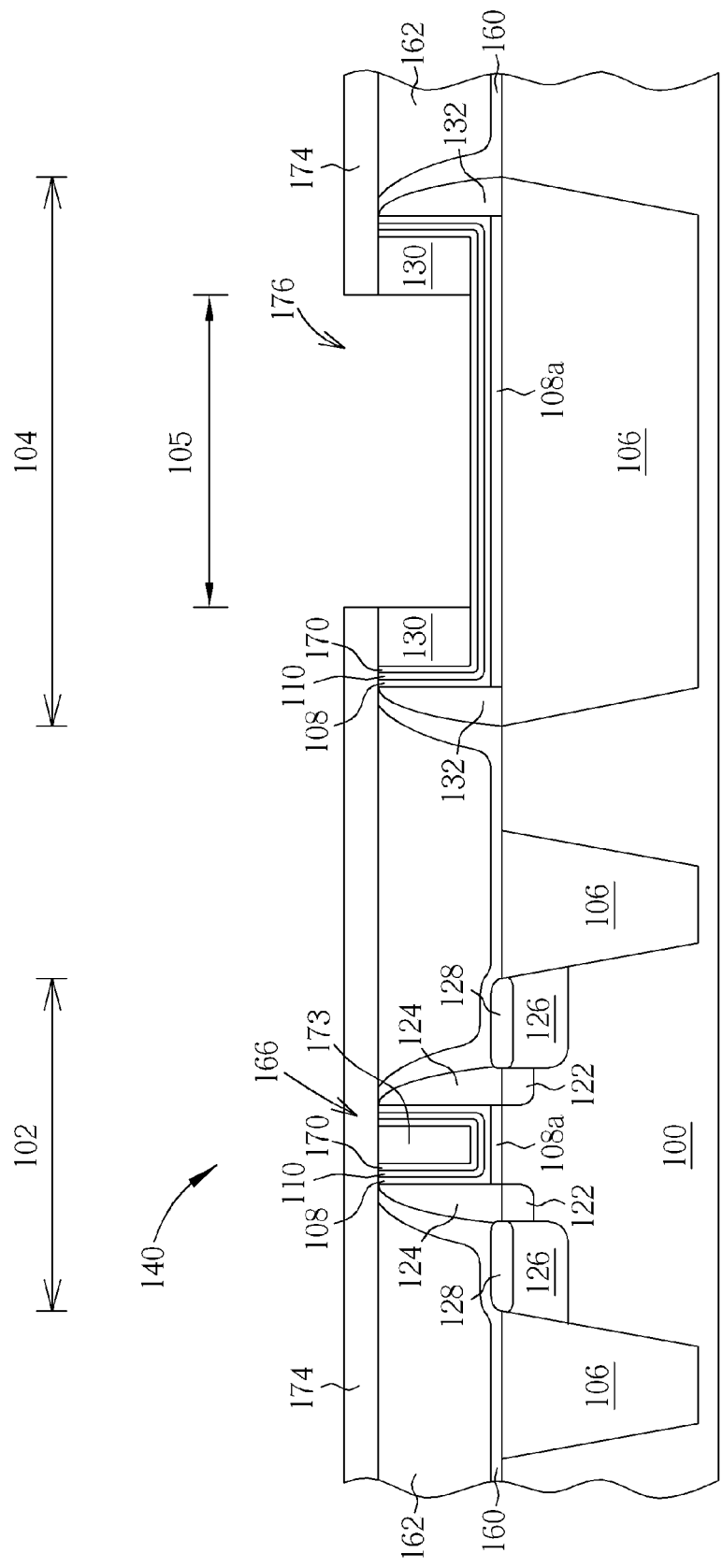
FIGS. 11-12 are schematic drawings illustrating a method for forming a resistor integrated with a transistor having a metal gate provided by second exemplary embodiments of the present invention.
Figure 12:
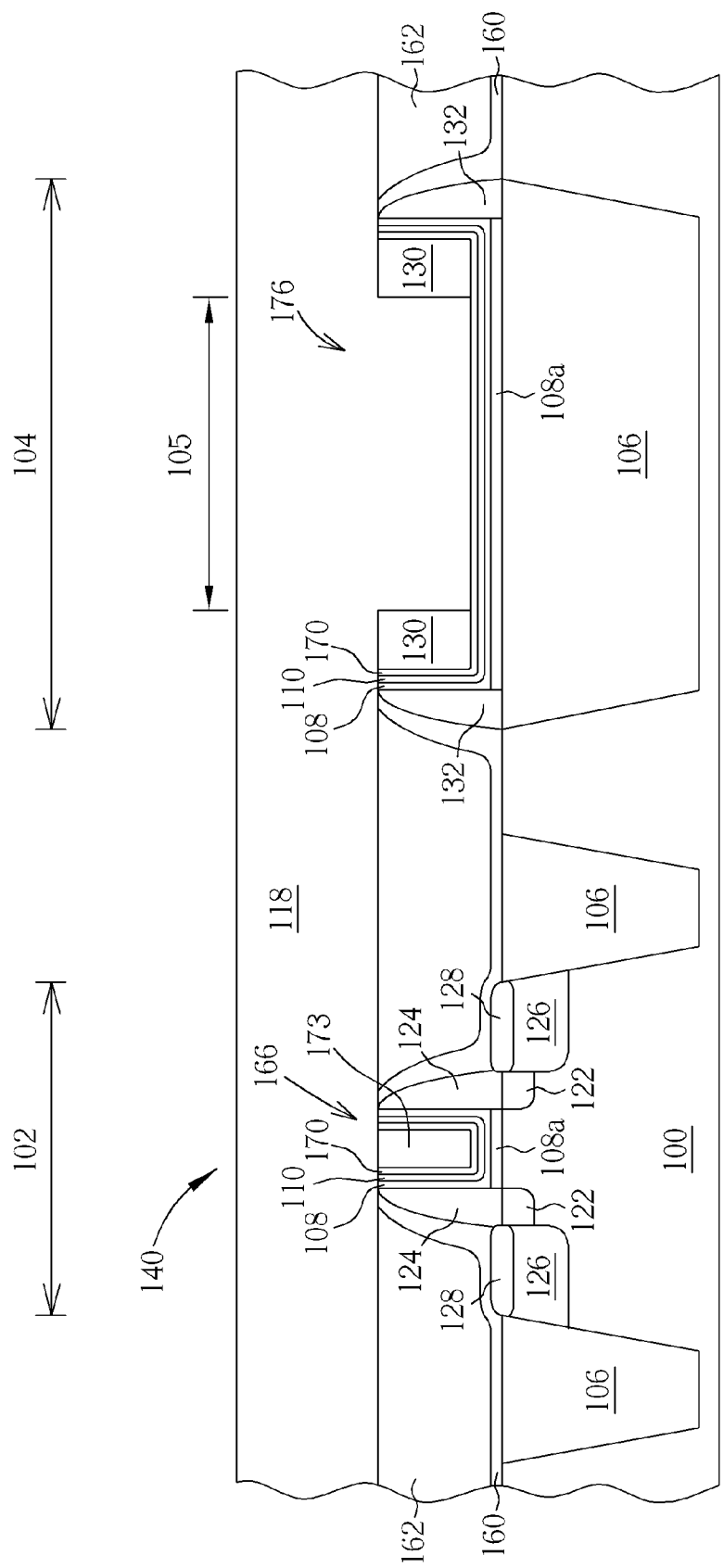

Please refer to FIGS. 11-12, which are schematic drawings illustrating a method for forming a resistor integrated with a transistor having a metal gate provided by second exemplary embodiments of the present invention. The only difference between the first and the second embodiments is that, in the first exemplary embodiments, the dielectric layer 108 covers the bottom of the resistor trench 168 only. In the second exemplary embodiments, however, the dielectric layer 108 not only covers the bottom of the resistor trench 168 but also the sidewalls of the resistor trench 168. Similarly to FIGS. 1-10, the same elements in both first and second exemplary embodiments are designated by the same numerals, and the material choices and steps for forming those elements are all omitted in the interest of brevity. According to on of the second exemplary embodiments, the method provided by the present invention can be integrated with the high-k last process. Similarly to FIGS. 1-2, a dielectric layer 108a includes a conventional SiO$_2$ layer is formed between the substrate 100 and the polysilicon layer 112. After removing the polysilicon layer 112 to form the gate trench 166 and the resistor trench 168, the dielectric layer 108a is exposed from the bottoms of the gate trench 166 and the resistor trench 168, which may serve as an interfacial layer. A high-k gate dielectric layer 108, including abovementioned materials, and a bottom barrier metal 110, as mentioned above, are then formed in the gate trench 166 and the resistor trench 168. Furthermore, an etch stop layer (not shown) can be formed on the bottom barrier metal 110.

Please refer to FIG. 11 again. After forming the etch stop layer, a work function metal layer 170 is formed in the gate trench 166 and the resistor trench 168. The work function metal layer 170 can include suitable materials providing an appropriate work function for p-type transistor or n-type transistor. The work function metal layer 170 has a work function that can be between 4.8 eV and 5.2 eV, or alternatively between 3.9 eV and 4.3 eV. Thereafter, a metal layer 172 is formed on the substrate 100 to fill up the gate trench 166 and the resistor trench 168. In the preferred embodiment, the metal layer 172 includes materials with low resistance and superior gap-filling characteristic. Additionally, a top barrier layer (not shown) can be formed between the work function metal layer 170 and the metal layer 172, if required. After forming the metal layer 172, similarly to FIGS. 3-6, a CMP process is performed to remove the unnecessary metal layer 172 and work function metal layer 170 until the topmost surface of the metal layer 172 is approximately leveled with the surface of the ILD layer 162, which simultaneously forms a gate metal 173 inside the gate trench 166, and a low resistance portion 175 (not shown) in the resistor trench 168. It is worth noting that parts of the low resistance portion 175 are replaced in the following steps in order to obtain a high resistance resistor within the resistor region 104. Then, as shown in FIG. 11, a patterned hard mask 174 is formed on the ILD layer 162. The patterned hard mask 174 may include SiN, NDC, or photoresist material, but not limited to this. It should be noted that, as in FIG. 4, the patterned hard mask 174 covers the surface within the transistor region 102 and the resistor region 104 but not the surface within the main region 105. An etching process is then carried out to remove the metal layer 172 (not shown) and to expose the work function metal layer 170 within the main region 105. Consequently, an opening 176 is formed to expose the surface of the work function metal layer 170 within the main region 105, while portions of the work function metal layer 170 inside the resistor region 104 are covered by metal bulks 130 formed at both ends of the resistor trench 168. Similar to FIG. 6, according to another embodiment in the second exemplary embodiments, the metal film 130a (not shown) may remain within the main region 105, so that it may be in electrical connect with the work function metal layer 170 and the metal bulks 130.

Please refer to FIG. 12. Similarly to FIG. 7, after forming the opening 176 within the main region 105, the patterned hard mask 174 (not shown) is removed optionally to expose the surface of the ILD layer 162, the gate metal 173, and the metal bulks 130. It should be noted that, a protection layer (not shown) may be formed underneath the patterned hard mask 174 in the transistor 140 region in order to prevent CESL 160 and spacers 124 and 132 from etching in the removing process of the patterned hard mask 174. According to another embodiment, the protection layer is not necessary if the patterned hard mask 174 remains. Thereafter, a deposition process is carried out to fill up the opening 176 with a filler 118. Depending on different requirements, the filler 118 may be selected from electrically conductive materials or electrically insulated materials. The following sequence is similar to the first embodiments; therefore, the same process is not described again for the sake of simplicity.

In summary, the present invention provides a method for forming a resistor integrated with a transistor having a metal gate that is easily integrated with the gate last process, the high-k first process, and the high-k last process. In other words, the method provided by the present invention can easily integrate the resistor and the transistor having a metal gate without increasing process complexity. Furthermore, according to the resistor and the method for forming a resistor integrated with a transistor having a metal gate, by modulating the doping concentration of the filler, the resistance of the filler may be adjusted to meet the demand of circuit design.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A structure of a resistor comprising:
   a substrate having a interfacial layer thereon;
   a resistor trench formed in the interfacial layer;
   at least a work function metal layer covering the surface of the resistor trench;
   at least two metal bulks located at two ends of the resistor trench and adjacent to the work function metal layer; and
   a filler formed between the two metal bulks inside the resistor trench, wherein the metal bulks are direct in contact with the filler, the filler comprises electrically conductive materials, and a resistance of the metal bulk is lower than a resistance of the electrically conductive material and a resistance of the work function metal layer.

2. The structure of the resistor according to claim 1, further comprising:
   a metal film located on a surface of the work function metal layer, wherein the metal film is in electrical connect with the work function metal layer and the metal bulks.

3. The structure of the resistor according to claim 1, wherein the electrically conductive material comprises doped-polysilicon.

4. The structure of the resistor according to claim 1, further comprising spacers in the interfacial layer, wherein sidewalls of the spacers are defined by the resistor trench.

5. The structure of the resistor according to claim 1, wherein the resistor is located above a shallow trench insulator embedded in the substrate.

6. The structure of the resistor according to claim 1, further comprising a high-k dielectric layer and a bottom barrier layer disposed under the work function metal layer.

7. The structure of the resistor according to claim 1, further comprising:
   an U-shaped high-k dielectric layer disposed under the work function metal layer.

8. The structure of the resistor according to claim 1, wherein the work function metal layer comprises an U-shaped work function metal layer disposed in the resistor trench.

9. A fabrication method of a resistor, comprising:
   providing a substrate having an interfacial layer thereon, wherein the interfacial layer has at least a resistor trench;
   forming a work function metal layer to cover an entire surface of the resistor trench;
   forming a metal layer to fill up the resistor trench;
   forming an opening in the metal layer and two metal bulks located at two ends of the resistor trench and adjacent to the work function metal layer; and
   filling a filler into the opening, wherein the filler is formed between the two metal bulks inside the resistor trench, the metal bulks are direct in contact with the filler, the filler comprises electrically conductive materials, and a resistance of the metal bulk is lower than a resistance of the electrically conductive material and a resistance of the work function metal layer.

10. The fabrication method of the resistor according to claim 9, wherein the opening exposes a portion of the work function metal layer on a bottom surface of the resistor trench.

11. The fabrication method of the resistor according to claim 9, further comprising:
   performing a polishing process to level a topmost surface of the filler with a surface of the interfacial layer.

12. The fabrication method of the resistor according to claim 9, further comprising:

performing an ion implantation process to adjust a doping concentration of the filler.

13. The fabrication method of the resistor according to claim 12, further comprising:
after performing the ion implantation process, performing an activation process to activate dopants inside the filler, wherein temperature of the activation process is less than 400 Degree C.

* * * * *